United States Patent
Luan et al.

(10) Patent No.: US 12,088,331 B2
(45) Date of Patent: Sep. 10, 2024

(54) SIGNAL TRANSMITTING METHOD AND APPARATUS, ELECTRONIC DEVICE, AND READABLE STORAGE MEDIUM

(71) Applicant: RDA MICROELECTRONICS (BEIJING) CO., LTD., Beijing (CN)

(72) Inventors: Yifu Luan, Beijing (CN); Kai Li, Beijing (CN); Liyun Luo, Beijing (CN); Lichao Hu, Beijing (CN)

(73) Assignee: RDA MICROELECTRONICS (BEIJING) CO., LTD., Beijing (CN)

( * ) Notice: Subject to any disclaimer, the term of this patent is extended or adjusted under 35 U.S.C. 154(b) by 47 days.

(21) Appl. No.: 18/157,851

(22) Filed: Jan. 23, 2023

(65) Prior Publication Data

US 2023/0163795 A1    May 25, 2023

Related U.S. Application Data

(63) Continuation of application No. PCT/CN2020/106438, filed on Jul. 31, 2020.

(30) Foreign Application Priority Data

Jul. 23, 2020 (CN) .................. 202010716115.6

(51) Int. Cl.
*H04B 1/04* (2006.01)
*H03M 1/66* (2006.01)
(52) U.S. Cl.
CPC ............ *H04B 1/0475* (2013.01); *H03M 1/66* (2013.01); *H04B 2001/0416* (2013.01)
(58) Field of Classification Search
CPC ......... H04B 1/0475; H04B 2001/0416; H04B 1/04; H04B 2001/0408; H03M 1/66
See application file for complete search history.

(56) References Cited

U.S. PATENT DOCUMENTS

2007/0247235 A1   10/2007  Gatta
2012/0201338 A1*  8/2012   Leung ................... H03C 3/095
                                                 375/376
(Continued)

FOREIGN PATENT DOCUMENTS

CA        2281522 A1   10/2001
CN      101084624 A    12/2007
(Continued)

OTHER PUBLICATIONS

The international search report and written opinion received in corresponding International Application PCT/CN2020/106438, mailed Apr. 12, 2021.

(Continued)

*Primary Examiner* — Sung S Ahn
(74) *Attorney, Agent, or Firm* — Kilpatrick Townsend & Stockton LLP

(57) ABSTRACT

Embodiments of the present disclosure provide a signal transmitting method. According to the method, in a signal transmitting process, before entering a digital to analog converter (DAC), a first frequency modulated signal of a high-pass channel is first subjected to nonlinear compensation and gain mismatch compensation. In the process, a nonlinear compensation coefficient and a gain mismatch compensation coefficient are determined according to an output voltage of the high-pass channel and an output frequency of a voltage-controlled oscillator (VCO) during a calibration stage.

20 Claims, 8 Drawing Sheets

(56) References Cited

U.S. PATENT DOCUMENTS

2014/0106681 A1* 4/2014 Leung .................... H04B 1/62
  455/73
2019/0319630 A1   10/2019 Chen et al.

FOREIGN PATENT DOCUMENTS

| CN | 102332912 A | 1/2012 |
| --- | --- | --- |
| CN | 104079269 A | 10/2014 |
| CN | 107005244 A | 8/2017 |
| CN | 108243132 A | 7/2018 |
| CN | 111049599 A | 4/2020 |

OTHER PUBLICATIONS

The first Office Action received in the corresponding CN Application 202010716115.6, mailed Mar. 2, 2021.
Notification to Grant Patent Right for Invention received in the corresponding CN Application 202010716115.6, mailed Aug. 16, 2021.
Dai, Xishi, "Design of a High Performance LC VCO for Broadband Application", published on vol. 44, No. 1 of Microelectronics on Feb. 2014.

* cited by examiner

SIGNAL TRANSMITTING METHOD AND APPARATUS, ELECTRONIC DEVICE, AND READABLE STORAGE MEDIUM

This Application is a continuation application of International Application No. PCT/CN2020/106438, filed on Jul. 31, 2020, which claims priority to Chinese Application No. 2020107161156, filed on Jul. 23, 2020, both of which are incorporated by reference herein.

TECHNICAL FIELD

Embodiments of the present disclosure relate to the field of wireless communication technology and, in particular, to a signal transmitting method and apparatus, an electronic device, and a readable storage medium.

BACKGROUND

With the rapid development of technology, more and more people enjoy videos, shopping, etc. by using mobile phones and other electronic devices. An electronic device generally transmits signals by using a transmitter.

SUMMARY

In a first aspect, an embodiment of the present disclosure provides a signal transmitting method, including:
  processing a to-be-transmitted signal of an electronic device to obtain a first frequency-modulated signal and a second frequency-modulated signal, the first frequency-modulated signal and the second frequency-modulated signal being two paths of same signals, and the electronic device working at a target carrier frequency;
  performing gain mismatch compensation on the first frequency-modulated signal by using a gain mismatch compensation coefficient corresponding to the target carrier frequency, to obtain a first frequency-modulated signal subjected to gain mismatch compensation, the gain mismatch compensation coefficient being determined according to an output voltage of a high-pass channel of a transmitter of the electronic device and an output frequency of a voltage-controlled oscillator (VCO) of the transmitter;
  converting the first frequency-modulated signal subjected to gain mismatch compensation into a first analog signal by using the high-pass channel;
  controlling the VCO by using the first analog signal and a second analog signal so that the VCO outputs a third analog signal, the second analog signal being obtained by converting the second frequency-modulated signal by using a low-pass channel; and
  transmitting the third analog signal.

In a second aspect, an embodiment of the present disclosure provides an electronic device, including a processor, a memory and an executable instruction, where the executable instruction is stored in the memory and is configured to be executed by the processor, and the executable instruction is used for executing the method in the above-mentioned first aspect.

In a third aspect, an embodiment of the present disclosure provides a computer-readable storage medium in which a computer-executable instruction is stored, where the computer-executable instruction is configured to, when executed by a processor, implement the method in the above-mentioned first aspect.

BRIEF DESCRIPTION OF DRAWINGS

To describe the technical solutions in the embodiments of the present disclosure more clearly, the accompanying drawings required for describing the embodiments will be briefly introduced below. Apparently, the accompanying drawings in the following description show only some embodiments of the present disclosure, and those of ordinary skill in the art may still derive other drawings from these drawings without creative efforts.

DESCRIPTION OF EMBODIMENTS

In order to make objectives, technical solutions and advantages of embodiments of the present disclosure clearer, the technical solutions in the embodiments of the present disclosure will be described clearly and completely below in conjunction with the accompanying drawings in the embodiments of the present disclosure. Apparently, the described embodiments are a part of the embodiments of the present disclosure, not all the embodiments. Based on the embodiments in the present disclosure, all other embodiments obtained by those of ordinary skill in the art without creative work shall fall within the protection scope of the present disclosure.

An electronic device usually transmits a signal by using a transmitter including a polar transmitter, a direct quadrature up-conversion transmitter, etc. The polar transmitter directly uses a phase locked loop (PLL) to modulate phase information and has advantages in power consumption and area over a comparison with the direct quadrature up-conversion transmitter. However, the PLL usually works in a closed-loop modulation mode to avoid frequency deviation, which causes influences from a loop bandwidth of the PLL on a bandwidth of a signal which may be transmitted by the polar transmitter. A two-point modulation transmitter inputs a to-be-transmitted signal into the PLL via two paths including a high-pass channel and a low-pass channel, so that the bandwidth of the signal will not be affected by the loop bandwidth of the PLL. A transmission function of the high-pass channel has a high-pass characteristic, and a transmission function of the low-pass channel has a low-pass characteristic. Theoretically, when the high-pass channel is matched with the low-pass channel, the two-point modulation transmitter forms an all-pass system. However, a voltage-controlled oscillator (VCO) in the two-point modulation transmitter is of a variable capacitor tube structure, due to process, environment, temperature and other reasons, there is often gain mismatch between the high-pass channel and the low-pass channel, which degenerates the performance of the two-point modulation transmitter. Therefore, it is necessary to calibrate the gain mismatch between the high-pass channel and the low-pass channel. In a common calibration method, a voltage comparison circuit is added at the VCO, and every time before a signal is transmitted, a gain between the high-pass channel and the low-pass channel is calibrated by the voltage comparison circuit by using an adaptive convergence algorithm.

Figure 1:
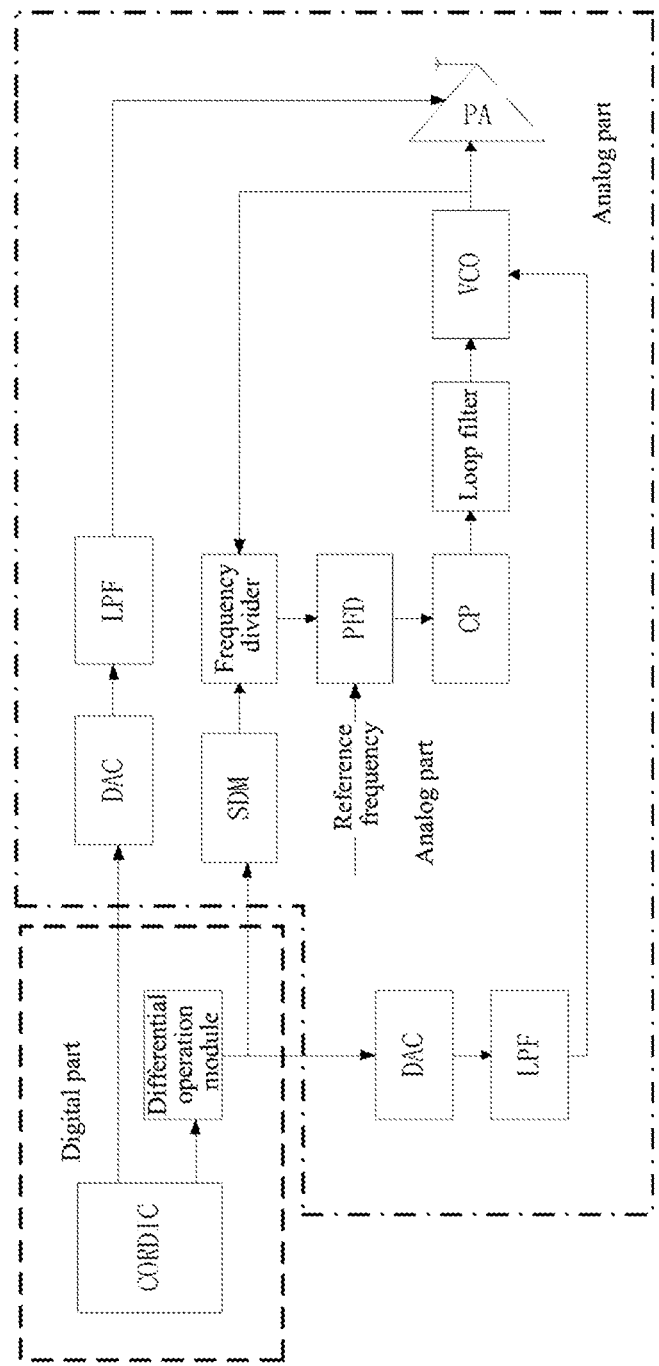
FIG. 1 is a schematic diagram of an architecture of a two-point modulation transmitter.

FIG. 1 is a schematic diagram of an architecture of a two-point modulation transmitter. Refer to FIG. 1, this architecture includes a digital part and an analog part, the digital part is shown as a dashed box in the figure, and the analog part is shown as a dash-dotted box in the figure. The analog part includes a digital to analog converter (DAC), a low-pass filter (LPF), a power amplifier (PA), a sigma-delta modulator (SDM), a PLL, etc. The PLL includes a frequency divider, a phase frequency detector (PFD), a charge pump (CP), a loop filter, a VCO, etc. The digital part includes a coordinate rotation digital computer (CORDIC) module and a differential operation (d/dt) module.

Refer to FIG. 1, a signal required to be modulated passes through the differential operation module to generate two paths of frequency-modulated signals, where one path of frequency-modulated signal enters the frequency divider via the SDM and is used for controlling a frequency division ratio of the PLL, and this channel presents a low-pass characteristic in terms of its transmission function and serves as a low-pass channel in two-point modulation. The other path of frequency-modulated signal is directly input from the DAC and the LPF to the VCO to control an oscillation frequency of the VCO in a form of voltage, and this channel presents a high-pass characteristic in terms of its transmission function and serves as a high-pass channel in two-point modulation. In the case that the high-pass channel is matched with the low-pass channel in time delay and gain, a transmission function of the two-point modulation transmitter has an all-pass characteristic.

However, due to process, environment, temperature and other reasons, there is often gain mismatch between the high-pass channel and the low-pass channel, which degenerates the performance of the two-point modulation transmitter. Therefore, it is necessary to calibrate the gain between the high-pass channel and the low-pass channel. In a common calibration method, a voltage comparison circuit is added at the VCO, and every time before a signal is transmitted, the gain between the high-pass channel and the low-pass channel is calibrated by using an adaptive convergence algorithm.

At the same time, with the increase of a speed and bandwidth of the signal, a frequency modulation range of the high-pass channel also needs to be widened. At the moment, nonlinear effects in voltage and frequency conversion are also non-ignorable in addition to the gain mismatch. The voltage and frequency conversion means that the VCO outputs a signal with a certain frequency under a normal condition. For example, if the resonance of the VCO is set to 2.4 GHz, the VCO outputs a waveform, such as a square wave and a sine wave, of which the frequency is 2.4 GHz. A voltage output by the DAC in the high-pass channel and a loop feedback voltage provided by the PLL may change a value of a variable capacitance on the VCO, and then modulation information is added into an output of the VCO.

Apparently, according to the above-mentioned addition of the voltage comparison circuit, besides that an additional circuit requires to be added, the gain mismatch between the high-pass channel and the low-pass channel in the two-point modulation transmitter is also taken into account, but nonlinear effects in voltage and frequency conversion of the high-pass channel are not taken into account.

In order to eliminate the nonlinear effects, a common way is to change a variable capacitor tube structure of the VCO so that a plurality of variable capacitor tubes are connected in parallel and controlled at different bias voltages, thereby directly improving the linearity during voltage and frequency conversion of the VCO.

The above-mentioned method for eliminating the nonlinear effects may only be improved by optimizing characteristics of the VCO itself, and this method needs to additional circuits and power consumption, which causes the increase of the cost and power consumption of an electronic device.

To this end, embodiments of the present disclosure provide a signal transmitting method and apparatus, an electronic device, and a readable storage medium. A gain mismatch compensation coefficient is determined according to a relationship between an output voltage of a high-pass channel and an output frequency of a VCO, gain matching and nonlinear compensation are performed, and no additional circuit needs to be added, so that the area, power consumption and cost of a two-point modulation transmitter are reduced, and thus the power consumption and cost of the electronic device are reduced.

The signal transmitting method provided in an embodiment of the present disclosure includes two stages: a first stage, that is, a calibration stage; and a second stage, that is, a signal transmitting stage. At the first stage, the two-point modulation transmitter measures a relationship between an output voltage of a DAC in a high-pass channel and an output frequency of a VCO and calculates a gain mismatch compensation coefficient and a nonlinear compensation coefficient according to a measurement result. During signal transmission at the second stage, a to-be-transmitted signal passes through a differential operation module to obtain two paths of frequency-modulated signals, that is, a first frequency-modulated signal and a second frequency-modulated signal, a nonlinear compensation module on the digital part of the two-point modulation transmitter performs nonlinear compensation on the first frequency-modulated signal by using the pre-calculated nonlinear compensation coefficient. Next, a gain matching module on the digital part of the two-point modulation transmitter performs, by using the pre-calculated gain mismatch compensation coefficient, gain mismatch compensation on the first frequency-modulated signal subjected to nonlinear compensation. Then, the first frequency-modulated signal subjected to nonlinear compensation and gain mismatch compensation is input into the DAC.

Below, the signal transmitting stage and the calibration stage are respectively described in detail.

Firstly, the calibration stage is described.

Figure 2:
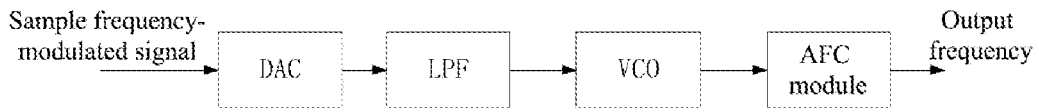
FIG. 2 is a measuring circuit for an output frequency of a VCO in a signal transmitting method provided in an embodiment of the present disclosure.

FIG. 2 is a measuring circuit for an output frequency of a VCO in a signal transmitting method provided in an embodiment of the present disclosure. Refer to FIG. 2, the measuring circuit includes a DAC, an LPF, a VCO and an automatic frequency control (AFC) module. The parts included in the measuring circuit are devices inherent to the two-point modulation transmitter, and therefore no additional circuit needs to be added. An electronic device usually needs to work at a plurality of frequencies owned by a 3rd-generation mobile communication (3G) system, the 4th generation mobile communication (4G), etc., different communication systems have different frequencies, and even the same communication system includes different frequency points. The plurality of working frequencies of the electronic device are referred to as working carrier frequencies, that is, the electronic device supports a plurality of working carrier frequencies. The two-point modulation transmitter completes carrier switching by using the AFC module, a local oscillator frequency of the two-point modulation transmitter is shifted to a target carrier frequency, and a gain mismatch compensation coefficient and a nonlinear compensation coefficient are calculated for the target carrier frequency, where the target carrier frequency is any one working carrier frequency of the electronic device. Then, the electronic device stores a corresponding among a target carrier frequency, a gain mismatch compensation coefficient and a nonlinear compensation coefficient into a register. During subsequent signal transmission, according to the current working carrier frequency, the electronic device finds the corresponding nonlinear compensation coefficient from the register to perform nonlinear compensation and finds the gain mismatch compensation coefficient from the register to perform gain compensation.

Figure 3:
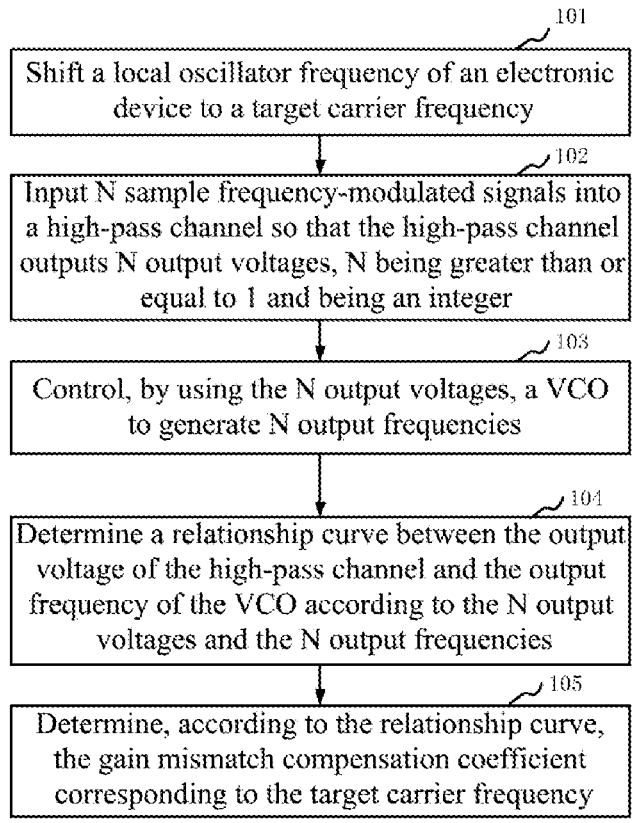
FIG. 3 is a process diagram of determining a gain mismatch compensation coefficient in a signal transmitting method provided in an embodiment of the present disclosure.

FIG. 3 is a process diagram of determining a gain mismatch compensation coefficient in a signal transmitting method provided in an embodiment of the present disclosure. The present embodiment includes the following.

101, shift a local oscillator frequency of the electronic device to the target carrier frequency.

Exemplarily, the electronic device shifts the local oscillator frequency of the electronic device to the target carrier frequency by using the AFC module in the two-point modulation transmitter. The local oscillator frequency is, for example, 2.4 GHz, the target carrier frequency is, for example, 2.5 GHz, 2.6 GHz, etc. The target carrier frequency is any one of a plurality of working carrier frequencies of the electronic device.

102, input N sample frequency-modulated signals into the high-pass channel so that the high-pass channel outputs N output voltages, N being greater than or equal to 1 and being an integer.

103, control, by using the N output voltages, the VCO to generate N output frequencies.

In steps 102 and 103, the electronic device presets N sample frequency-modulated signals marked as $x_i$, i=1, 2, ... N. $x_i$ represents a normalized frequency-modulated signal, $x_i \in (-1,1)$ that is, a value of $x_i$ is -1, -0.8, -0.6 ... 0.6, 0.8, 1, etc. Every time when one of the sample frequency-modulated signals is input, a PM DAC outputs a constant-amplitude voltage to trigger the AFC module to measure an output frequency of the VCO to this voltage. For example, when $x_1 = -1$ is input, a constant voltage is 0 mV. When $x_N = 1$ is input, a constant voltage is 400 mV. Therefore, every time when one of the sample frequency-modulated signals is input, the VCO outputs an analog signal, and the AFC module measures a frequency of this analog signal to obtain an output frequency. After the N sample frequency-modulated signals are input, the AFC may measure N output frequencies.

104, determine a relationship curve between the output voltage of the high-pass channel and the output frequency of the VCO according to the N output voltages and the N output frequencies.

Exemplarily, the N output voltages are the above-mentioned N constant-amplitude voltages, and the electronic device determines the relationship curve according to the N constant-amplitude voltages and the N output frequencies. N represents a sampling precision.

105, determine, according to the relationship curve, the gain mismatch compensation coefficient corresponding to the target carrier frequency.

Exemplarily, the electronic device may determine the gain mismatch compensation coefficient according to the relationship curve, a least square method, etc.

With this solution, the purpose of determining the gain mismatch compensation coefficient according to devices of the two-point modulation transmitter itself is achieved, and no additional circuit needs to be added, so that the cost and the volume of the two-point modulation transmitter are reduced.

In the above-mentioned embodiment, when the electronic device determines the relationship curve between the output voltage of the high-pass channel and the output frequency of the VCO according to the N output voltages and the N output frequencies, specifically, N frequency differences are obtained by using the N output frequencies and the local oscillator frequency, and the relationship curve is determined according to the N frequency differences and the N sample frequency modulated signals. The maximum value in the N frequency differences is greater than a working difference, and the working difference is used for indicating a maximum frequency modulation range of the high-pass channel when the electronic device works at the target carrier frequency.

For each output frequency of the N output frequencies, the electronic device subtracts the local oscillator frequency from the output frequency to obtain $Freq_i$, thereby obtaining N $Freq_i$ s. Exemplarily, refer to FIG. 4.

Figure 4:
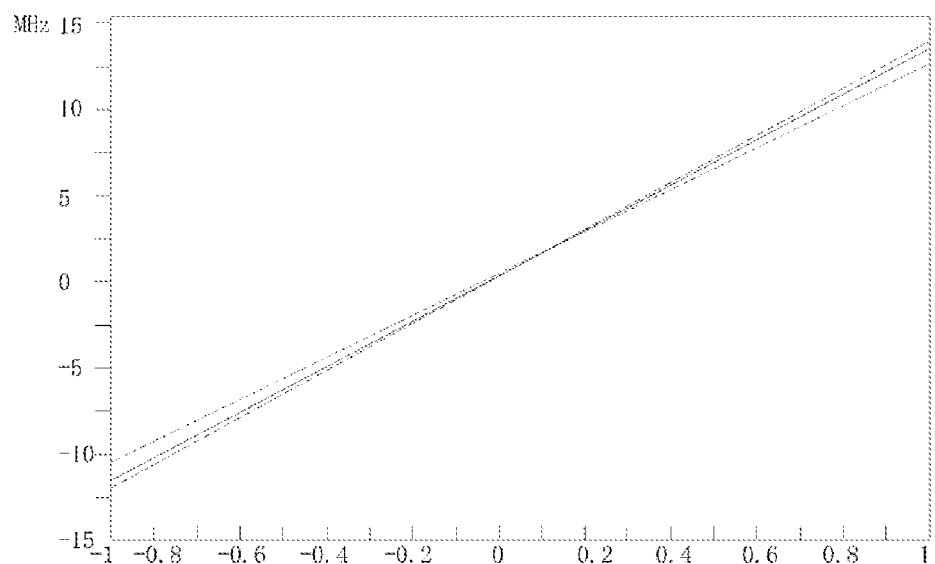
FIG. 4 is a schematic diagram of a relationship curve between a frequency difference and a sample frequency-modulated signal in a signal transmitting method provided in an embodiment of the present disclosure.

FIG. 4 is a schematic diagram of a relationship curve between a frequency difference and a sample frequency-modulated signal in a signal transmitting method provided in an embodiment of the present disclosure. Refer to FIG. 4, when the local oscillator frequency is 2.4 GHz, a relationship between $Freq_i$ and $x_i$ is shown as a full line in the figure. When the local oscillator frequency is 2.44 GHz, a relationship between $Freq_i$ and $x_i$ is shown as a dashed line in the figure. When the local oscillator frequency is 2.48 GHz, a relationship between $Freq_i$ and $x_i$ is shown as a dash-dotted line in the figure. Apparently, the maximum value of $Freq_i$ is approximately ±12 MHz, and an absolute value of the maximum value of $Freq_i$ is greater than the maximum frequency modulation range of the high-pass channel when the electronic device works at the target carrier frequency, such as 9 MHz. During an actual implementation, a working difference $Freq_{max}$ is determined according to the target carrier frequency of the electronic device, a relationship curve between the frequency difference and the sample frequency-modulated signal is obtained later, and then the gain mismatch compensation coefficient may be determined according to this relationship curve and the working difference $Freq_{max}$.

It needs to be noted that FIG. 4 shows the relationship between $Freq_i$ and $x_i$, however, the output voltages of the high-pass channel have a one-to-one correspondence with $x_i$, and the output frequencies of the VCO have a one-to-one correspondence with $Freq_i$. Therefore, the relationship range shown in FIG. 4 is equivalent to the relationship between the output voltage of the high-pass channel and the output frequency of the VCO.

In the above-mentioned embodiment, after the relationship curve between the frequency difference and the sample frequency-modulated signal is determined, the relationship between the frequency difference and the sample frequency-modulated signal is fitted with various methods. With cubic polynomial fitting as an example, that is, it is assumed that $Freq_i$ and $x_i$ satisfy the following relationship formula (1):

$$f(x_i) = a \cdot x_i^3 + b \cdot x_i^2 + c \cdot x_i = Freq_i \quad (1)$$

Polynomial coefficients a, b and c in the formula (1) may be solved by using the least square method. Exemplarily, formulae (2) and (3) are shown as follows:

$$\bar{X} = \begin{bmatrix} x_1^3 & x_1^2 & x_1 \\ x_2^3 & x_2^2 & x_2 \\ \vdots & \vdots & \vdots \\ x_N^3 & x_N^2 & x_N \end{bmatrix} \quad (2)$$

$$[a, b, c]^T = (\bar{X}^T \cdot \bar{X})^{-1} \cdot \bar{X}^T \cdot [Freq_1, Freq_2, \ldots, Freq_N]^T \quad (3)$$

In the above-mentioned embodiment, each target carrier frequency corresponds to one working difference $Freq_{max}$, and this working difference $Freq_{max}$ is a known quantity. Therefore, after the polynomial coefficients a, b and c are solved, the gain mismatch compensation coefficient $Gain_{comp}$ may be determined according to the following formula (4).

$$Freq_{max} = a \cdot Gain_{comp}^3 + b \cdot Gain_{comp}^2 + c \cdot Gain_{comp} \quad (4)$$

When the gain mismatch compensation coefficient $Gain_{comp}$ is solved according to the formula (4), solution methods include a general formula solution, a newton iteration method, etc., which is not limited in the embodiment of the present disclosure.

With this method, the purpose of accurately determining the gain mismatch compensation coefficient is achieved by fitting the relationship curve between the frequency difference and the sample frequency-modulated signal.

In the above-mentioned embodiment, after determining the gain mismatch compensation coefficient, the electronic device further determines a preset number of sampling points from the relationship curve by using the gain mismatch compensation coefficient and the relationship curve, and determines the nonlinear compensation coefficient according to each point in the preset number of sampling points, to obtain a preset number of nonlinear compensation coefficients.

With FIG. 4 as an example, the above-mentioned gain mismatch compensation coefficient is usually a number less than 1. After determining the gain mismatch compensation coefficient $Gain_{comp}$, the electronic device may intercept, from the relationship curve, a part of the curve which is used for calculating the nonlinear compensation coefficient. A value range of horizontal coordinates x of this segment of curve is $x \in (-Gain_{comp}, Gain_{comp})$. For example, if the gain mismatch compensation coefficient is 0.8, a curve in which a value of x is within a range of (−0.8, 0.8) is intercepted from the relationship curve. Accordingly, a value range of longitudinal coordinates is $f(x)$, $x \in (-Gain_{comp}, Gain_{comp})$. Then, several sampling points, for example, 16 sampling points, are taken from this segment of curve. Finally, for each of these sampling points, a nonlinear compensation coefficient may be determined according to coordinates, etc. of each of the sampling points, and thus the preset number of nonlinear compensation coefficients are obtained.

It can be known from the above description that, for each target carrier frequency, a group of nonlinear compensation coefficients corresponding to this target carrier frequency may be further determined after a gain mismatch compensation coefficient is determined by using the above-mentioned method. Then, a correspondence among the target carrier frequency, the gain mismatch compensation coefficient of the target carrier frequency and the nonlinear compensation coefficient of the target carrier frequency is stored into a register by the electronic device so as to be used later during normal signal transmission.

In the above-mentioned embodiment, the electronic device extracts some sampling points by using the above-mentioned relationship curve and gain mismatch compensation coefficient and determines the nonlinear compensation coefficients based on these sampling points. However, the embodiment of the present disclosure is not limited thereto. For example, after determining $f(x)$ as above, the electronic device calculates an inversion function $g(x)$ according to the $f(x)$. During nonlinear compensation, the input sampling points xi are directly substituted into this inversion function to calculate $g(xi)$, and thus a nonlinear compensation output may be obtained.

In the above-mentioned embodiment, since the electronic device has a plurality of working carrier frequencies, when working in case of frequency hopping, in order to avoid a need for calibration before each transmission, the electronic device needs to calibrate these working carrier frequencies or select K carrier frequencies therefrom for calibration when the electronic device is started, and compensation coefficients obtained from start calibration are used, by interpolation, according to the current working carrier frequency during subsequent signal transmission. Theoretically, an output frequency of the VCO has a cubic relationship with an input voltage, and during actual use, various interpolation methods such as a high-order polynomial interpolation method, a parabolic interpolation method, a linear interpolation method may be used according to a frequency range, a precision requirement, etc. Below, the above-mentioned calibration process will be described in detail with an example in which K working carrier frequencies need to be calibrated during a start process and there are N sample frequency-modulated signals in total. Exemplarily, refer to FIG. 5.

Figure 5:
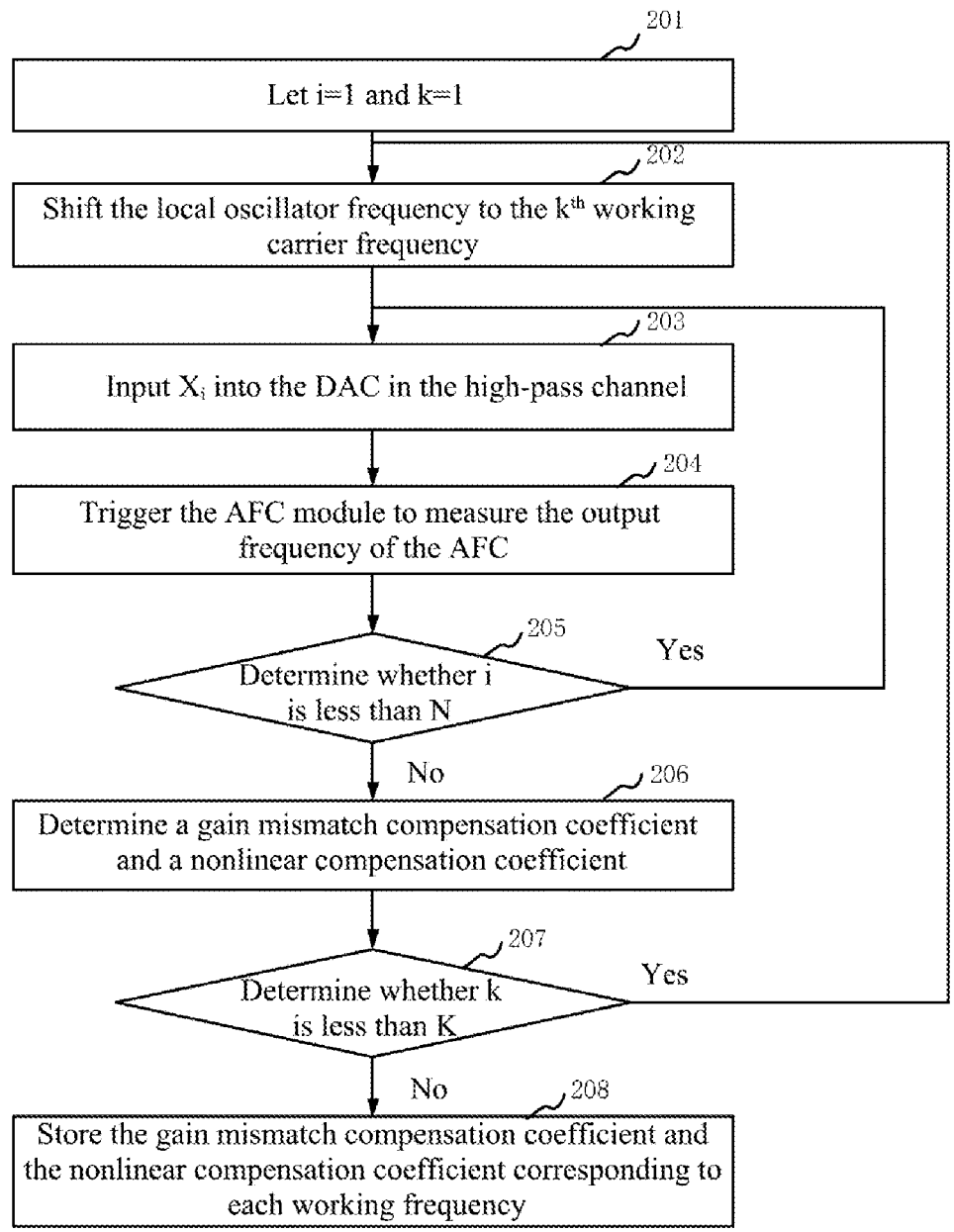
FIG. 5 is a process diagram of start calibration (power-on calibration) in a signal transmitting method provided in an embodiment of the present disclosure.

FIG. 5 is a process diagram of start calibration in a signal transmitting method provided in an embodiment of the present disclosure. Refer to FIG. 5, the present embodiment includes the following.

201, let i=1 and k=1.

202, shift the local oscillator frequency to the $k^{th}$ working carrier frequency.

203, input $x_i$ into the DAC in the high-pass channel.

204, trigger the AFC module to measure the output frequency of the AFC.

205, determine whether i is less than N, if i<N, i is plus 1, and proceed with execution of step 203; and if i≥N, proceed with execution of step 206.

206, determine a gain mismatch compensation coefficient and a nonlinear compensation coefficient.

207, determine whether k is less than K, if k<K, k is plus 1, and proceed with execution of step 202; if k≥K, proceed with execution of step 208.

208, store the gain mismatch compensation coefficient and the nonlinear compensation coefficient corresponding to each working frequency.

In the above-mentioned embodiment, the working carrier frequencies are calibrated during a start process, so that recalibration is not required in each subsequent data transmission. That is, for a frequency hopping system, such as Bluetooth, a plurality of frequency points are subjected to start calibration during the above-mentioned calibration, so that the transmitter of the electronic device does not need to be calibrated before each transmission.

Secondly, the signal transmitting stage is described.

Figure 6:
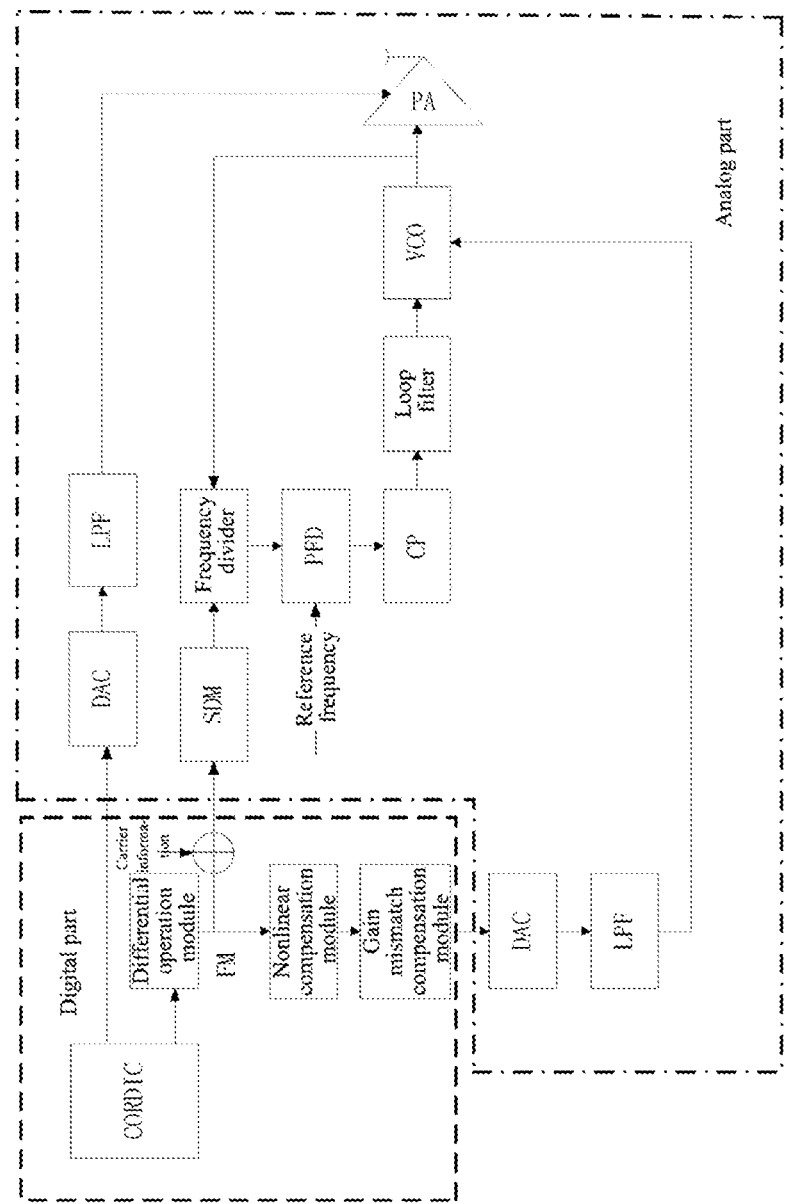
FIG. 6 is a schematic diagram of an architecture of a two-point modulation transmitter for performing a signal transmitting method provided in an embodiment of the present disclosure.

Exemplarily, refer to FIG. 6. FIG. 6 is a schematic diagram of an architecture of a two-point modulation transmitter for performing a signal transmitting method provided in an embodiment of the present disclosure. Refer to FIG. 6, the two-point modulation transmitter provided in the embodiment of the present disclosure includes an analog part and a digital part, where the digital part further includes a nonlinear compensation module and a gain matching module in addition to a CORDIC module and a differential operation module. A to-be-transmitted signal passes through the differential operation module to obtain two paths of frequency-modulated signals, that is, a first frequency-modulated signal and a second frequency-modulated signal, and the first frequency-modulated signal, after being subjected to nonlinear compensation and gain mismatch compensation, reaches the VCO via the high-pass channel.

Figure 7:
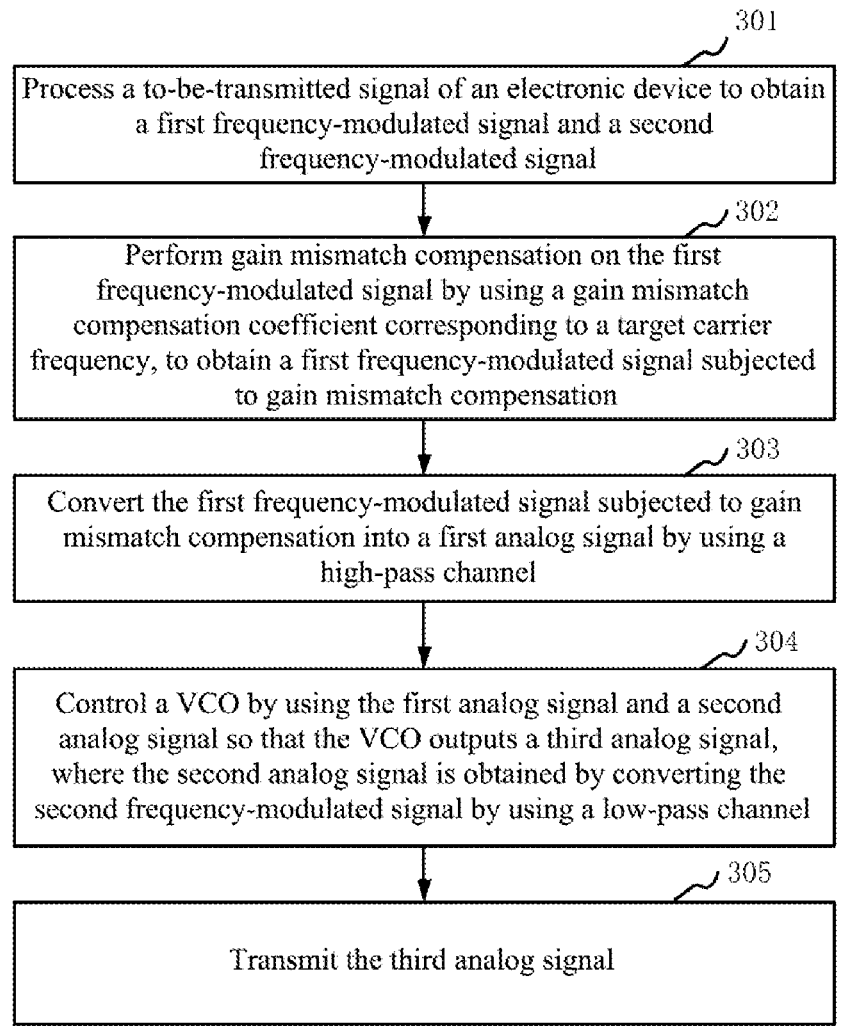
FIG. 7 is a process diagram of a signal transmitting method provided in an embodiment of the present disclosure.

FIG. 7 is a process diagram of a signal transmitting method provided in an embodiment of the present disclosure. Refer to FIG. 7, the present embodiment includes the following.

301, process a to-be-transmitted signal of an electronic device to obtain a first frequency-modulated signal and a second frequency-modulated signal.

The first frequency-modulated signal and the second frequency-modulated signal are two paths of same signals, and the electronic device works at a target carrier frequency.

Exemplarily, refer to FIG. 6, the to-be-transmitted signal passes through the differential operation module to obtain two paths of same frequency-modulated signals, that is, the first frequency-modulated signal and the second frequency-modulated signal.

302, perform gain mismatch compensation on the first frequency-modulated signal by using a gain mismatch compensation coefficient corresponding to the target carrier frequency, to obtain a first frequency-modulated signal subjected to gain mismatch compensation.

The gain mismatch compensation coefficient is determined according to an output voltage of a high-pass channel of a transmitter of the electronic device and an output frequency of a voltage-controlled oscillator VCO of the transmitter.

Exemplarily, refer to FIG. 6, the first frequency-modulated signal passes through the gain compensation module by which gain compensation is performed on the first frequency-modulated signal. For example, the electronic device performs a quadrature operation or the like on the first frequency-modulated signal and the gain compensation coefficient.

In addition, before the gain compensation, the electronic device may further perform nonlinear compensation on the first frequency-modulated signal. During the nonlinear compensation, the first frequency-modulated signal passes through the linear compensation module by which linear compensation is performed on the first frequency-modulated signal. During an actual implementation, the electronic device determines the nonlinear compensation coefficient of the first frequency-modulated signal by means of looking up a table, etc. For example, if the current working carrier frequency has a preset number of nonlinear compensation coefficients, the electronic device determines a target linear compensation coefficient from the preset number of nonlinear compensation coefficients according to an amplitude of the first frequency-modulated signal, and performs nonlinear compensation on the first frequency-modulated signal by using the target linear compensation coefficient, for example, the target linear compensation coefficient and the first frequency-modulated signal are subjected to a summation operation, a quadrature operation or the like.

It can be known from step 302 that the first frequency-modulated signal, before being input into the DAC of the high-pass channel, is first subjected to nonlinear compensation and gain mismatch compensation. In other words, the nonlinear compensation and the gain mismatch compensation occur in the digital part of the transmitter.

303, convert the first frequency-modulated signal subjected to gain mismatch compensation into a first analog signal by using the high-pass channel.

Exemplarily, this first analog signal is, for example, a voltage signal, a current signal or the like.

304, control the VCO by using the first analog signal and a second analog signal so that the VCO outputs a third analog signal, where the second analog signal is obtained by converting the second frequency-modulated signal by using a low-pass channel.

305, transmit the third analog signal.

Exemplarily, the electronic device transmits, through a radio frequency, the third analog signal to, for example, a Bluetooth device, a base station, etc. which is not limited in the embodiment of the present disclosure.

According to the signal transmitting method provided in the embodiment of the present disclosure, in a signal transmitting process, before entering a DAC, a first frequency modulated signal of a high-pass channel is first subjected to nonlinear compensation and gain mismatch compensation. The compensated first frequency-modulated signal is converted into a first analog signal on the high-pass channel, a first frequency-modulated signal on a low-pass channel is converted into a second analog signal, the VCO is controlled by using the two analog signals so that the VCO outputs a third analog signal, and finally the third analog signal is transmitted. In the process, a nonlinear compensation coefficient and a gain mismatch compensation coefficient are determined according to an output voltage of the high-pass channel and an output frequency of the voltage-controlled oscillator VCO during a calibration stage. Therefore, the high-pass channel is not required to be calibrated in the transmitting process. Moreover, calibration circuits in the calibration stage are all original circuits in a transmitter, and no additional circuit needs to be added, thereby avoiding increasing the cost and power consumption of the transmitter and thus the cost and power consumption of the electronic device. In addition, nonlinear calibration is further introduced, thereby avoiding non-linear effects in voltage and frequency conversion of the high-pass channel, and further improving the quality of signal transmission.

An embodiment apparatus of the present disclosure will be described below and may be used for performing the method embodiment of the present disclosure. For details not disclosed in the apparatus embodiment of the present disclosure, reference may be made to the method embodiment of the present disclosure.

Figure 8:
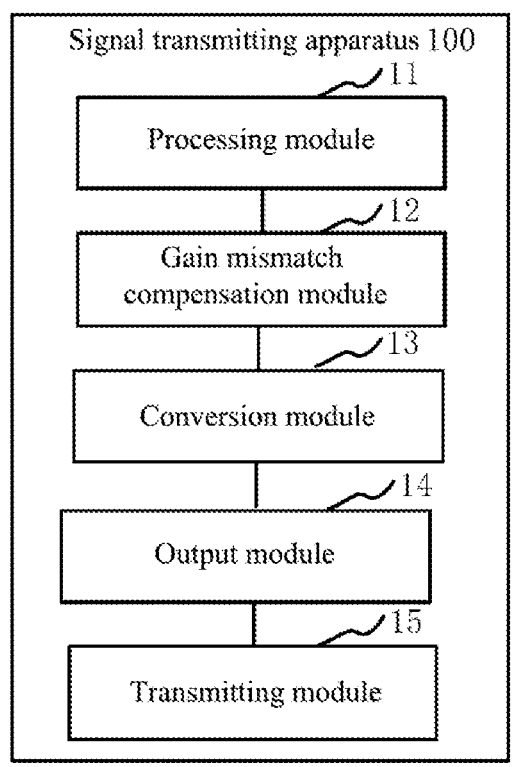
FIG. 8 is a schematic structural diagram of a signal transmitting apparatus provided in an embodiment of the present disclosure.

FIG. 8 is a schematic structural diagram of a signal transmitting apparatus provided in an embodiment of the present disclosure. The signal transmitting apparatus 100 may be implemented by means of software and/or hardware. As shown in FIG. 8, the signal transmitting apparatus 100 includes:

- a processing module 11 configured to process a to-be-transmitted signal of an electronic device to obtain a first frequency-modulated signal and a second frequency-modulated signal, the first frequency-modulated signal and the second frequency-modulated signal being two paths of same signals, and the electronic device working at a target carrier frequency;
- a gain mismatch compensation module 12 configured to perform gain mismatch compensation on the first frequency-modulated signal by using a gain mismatch compensation coefficient corresponding to the target carrier frequency, to obtain a first frequency-modulated signal subjected to gain mismatch compensation, the gain mismatch compensation coefficient being determined according to an output voltage of a high-pass channel of a transmitter of the electronic device and an output frequency of a voltage-controlled oscillator VCO of the transmitter;
- a conversion module 13 configured to convert the first frequency-modulated signal subjected to gain mismatch compensation into a first analog signal by using the high-pass channel;
- an output module 14 configured to control the VCO by using the first analog signal and a second analog signal so that the VCO outputs a third analog signal, the second analog signal being obtained by converting the second frequency-modulated signal by using a low-pass channel; and
- a transmitting module 15 configured to transmit the third analog signal.

Figure 9:
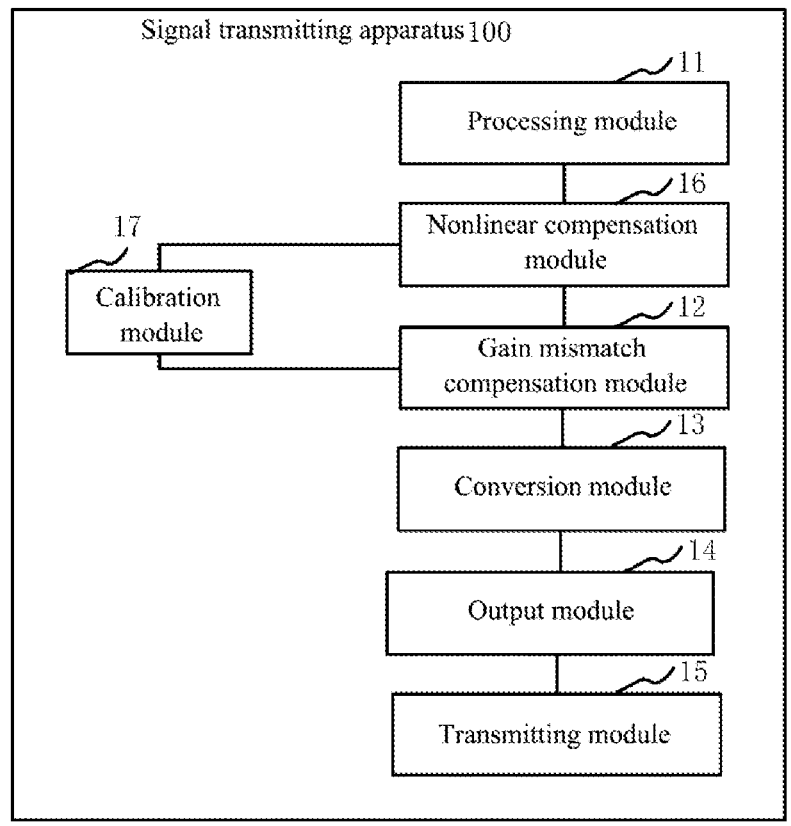
FIG. 9 is a schematic structural diagram of another signal transmitting apparatus provided in an embodiment of the present disclosure.

FIG. 9 is a schematic structural diagram of another signal transmitting apparatus provided in an embodiment of the present disclosure. On the basis of the above-mentioned FIG. 8, the signal transmitting apparatus 100 further includes:

- a nonlinear compensation module 16 configured to perform nonlinear compensation on the first frequency-modulated signal by using a nonlinear compensation coefficient before the gain mismatch compensation module 12 performs gain mismatch compensation on the first frequency-modulated signal by using the gain mismatch compensation coefficient to obtain the first frequency-modulated signal subjected to gain mismatch compensation, the nonlinear compensation coefficient being determined according to the gain mismatch compensation coefficient, the output voltage of the high-pass channel and the output frequency of the voltage-controlled oscillator VCO.

Refer to FIG. 9 again, on the basis of the above-mentioned FIG. 8, the above-mentioned signal transmitting apparatus 100 further includes:

- a calibration module 17 configured to: shift a local oscillator frequency of the electronic device to the target carrier frequency; input N sample frequency-modulated signals into the high-pass channel so that the high-pass channel outputs N output voltages, N being greater than or equal to 1 and being an integer; control, by using the N output voltages, the VCO to generate N output frequencies; determine a relationship curve between the output voltage of the high-pass channel and the output frequency of the VCO according to the N output voltages and the N output frequencies; and determine, according to the relationship curve, the gain mismatch compensation coefficient corresponding to the target carrier frequency, before the gain mismatch compensation module 12 performs the gain mismatch compensation on the first frequency-modulated signal by using the gain mismatch compensation coefficient corresponding to the target carrier frequency to obtain the first frequency-modulated signal subjected to gain mismatch compensation.

In a feasible design, when determining the relationship curve between the output voltage of the high-pass channel and the output frequency of the VCO according to the N output voltages and the N output frequencies, the calibration module 17 is configured to: obtain N frequency differences by using the N output frequencies and the local oscillator frequency, a maximum value in the N frequency differences being greater than a working difference, and the working difference being used for indicating a maximum frequency modulation range of the high-pass channel when the electronic device works at the target carrier frequency; and determine the relationship curve according to the N frequency differences and the N sample frequency modulated signals.

In a feasible design, the calibration module 17 is further configured to determine a preset number of sampling points from the relationship curve by using the gain mismatch compensation coefficient and the relationship curve, and determine the nonlinear compensation coefficient according to each point in the preset number of sampling points, to obtain a preset number of nonlinear compensation coefficients.

In a feasible design, when performing the nonlinear compensation on the first frequency-modulated signal by using the nonlinear compensation coefficient, the nonlinear compensation module 16 is configured to: determine a target nonlinear compensation coefficient from the preset number of nonlinear compensation coefficients according to an amplitude of the first frequency-modulated signal; and perform the nonlinear compensation on the first frequency-modulated signal by using the target nonlinear compensation coefficient.

In a feasible design, when performing the gain mismatch compensation on the first frequency-modulated signal by using the gain mismatch compensation coefficient corresponding to the target carrier frequency, the gain mismatch compensation module 12 is configured to: perform the gain mismatch compensation on the first frequency-modulated signal in a digital domain of the transmitter of the electronic device by using the gain mismatch compensation coefficient corresponding to the target carrier frequency, to obtain the first frequency-modulated signal subjected to gain mismatch compensation.

In a feasible design, the calibration module 17 shifts the local oscillator frequency of the electronic device to the target carrier frequency and is specifically configured to shift the local oscillator frequency of the electronic device to the target carrier frequency when the electronic device is started.

The signal transmitting apparatus provided in the embodiment of the present disclosure may execute actions of the electronic device in the above-mentioned method embodiment, which is implemented with similar principles and produces similar technical effects; and details will not be repeated herein.

Figure 10:
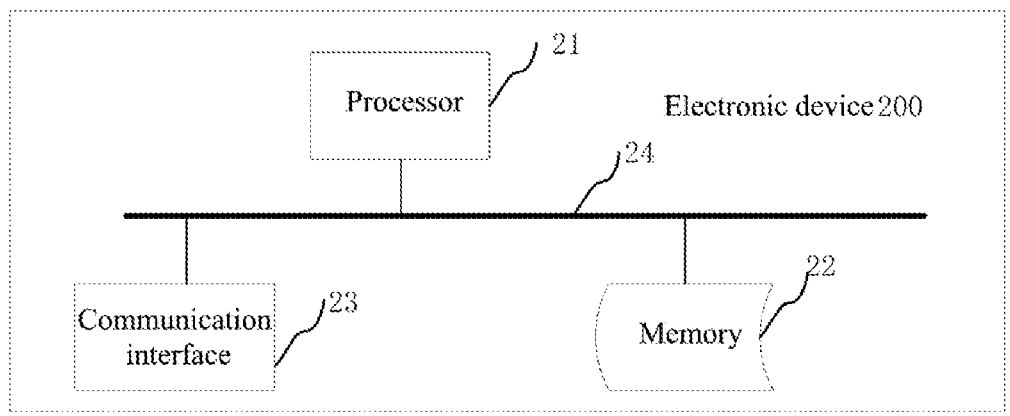
FIG. 10 is a schematic structural diagram of an electronic device provided in an embodiment of the present disclosure.

FIG. 10 is a schematic structural diagram of an electronic device provided in an embodiment of the present disclosure. As shown in FIG. 10, the electronic device 200 includes:

a processor 21 and a memory 22;
where an executable instruction is stored in the memory 22;
the at least one processor 21 executes the executable instruction stored in the memory 22 so that the processor 21 executes the above-mentioned method applied to the electronic device.

Reference may be made to the above-mentioned method embodiment for a specific implementation process of the processor 21 which is implemented with similar principles and produces similar technical effects; and details will not be repeated in the present embodiment.

In an implementation, the electronic device 200 further includes a communication interface 23, where the processor 21, the memory 22 and the communication interface 23 may be connected by a bus 24.

An embodiment of the present disclosure further provides a computer-readable storage medium in which an executable instruction is stored, where the executable instruction is configured to, when executed by a processor, implement the above-mentioned method applied to an electronic device.

Embodiments of the present disclosure provide a signal transmitting method and apparatus, an electronic device, and a readable storage medium. A gain mismatch compensation coefficient is determined according to a relationship between an output voltage of a high-pass channel and an output frequency of a VCO, gain matching and nonlinear compensation are performed, and no additional circuit needs to be added, so that the area, power consumption and cost of a two-point modulation transmitter are reduced, and thus the power consumption and cost of the electronic device are reduced.

In a first aspect, an embodiment of the present disclosure provides a signal transmitting method, including:

processing a to-be-transmitted signal of an electronic device to obtain a first frequency-modulated signal and a second frequency-modulated signal, the first frequency-modulated signal and the second frequency-modulated signal being two paths of same signals, and the electronic device working at a target carrier frequency;

performing gain mismatch compensation on the first frequency-modulated signal by using a gain mismatch compensation coefficient corresponding to the target carrier frequency, to obtain a first frequency-modulated signal subjected to gain mismatch compensation, the gain mismatch compensation coefficient being determined according to an output voltage of a high-pass channel of a transmitter of the electronic device and an output frequency of a voltage-controlled oscillator VCO of the transmitter;

converting the first frequency-modulated signal subjected to gain mismatch compensation into a first analog signal by using the high-pass channel;

controlling the VCO by using the first analog signal and a second analog signal so that the VCO outputs a third analog signal, the second analog signal being obtained by converting the second frequency-modulated signal by using a low-pass channel; and transmitting the third analog signal.

In a feasible design, before performing the gain mismatch compensation on the first frequency-modulated signal by using the gain mismatch compensation coefficient corresponding to the target carrier frequency, to obtain the first frequency-modulated signal subjected to gain mismatch compensation, the method further includes:

performing nonlinear compensation on the first frequency-modulated signal by using a nonlinear compensation coefficient, the nonlinear compensation coefficient being determined according to the gain mismatch compensation coefficient, the output voltage of the high-pass channel and the output frequency of the voltage-controlled oscillator VCO.

In a feasible design, before performing the gain mismatch compensation on the first frequency-modulated signal by using the gain mismatch compensation coefficient corresponding to the target carrier frequency to obtain the first frequency-modulated signal subjected to gain mismatch compensation to obtain the first frequency-modulated signal subjected to gain mismatch compensation, the method further includes:

shifting a local oscillator frequency of the electronic device to the target carrier frequency; inputting N sample frequency-modulated signals into the high-pass channel so that the high-pass channel outputs N output voltages, N being greater than or equal to 1 and being an integer; controlling, by using the N output voltages, the VCO to generate N output frequencies; determining a relationship curve between the output voltage of the high-pass channel and the output frequency of the VCO according to the N output voltages and the N output frequencies; and determining, according to the relationship curve, the gain mismatch compensation coefficient corresponding to the target carrier frequency.

In a feasible design, determining the relationship curve between the output voltage of the high-pass channel and the output frequency of the VCO according to the N output voltages and the N output frequencies includes: obtaining N frequency differences by using the N output frequencies and the local oscillator frequency, a maximum value in the N frequency differences being greater than a working difference, and the working difference being used for indicating a maximum frequency modulation range of the high-pass channel when the electronic device works at the target carrier frequency; and determining the relationship curve according to the N frequency differences and the N sample frequency modulated signals.

In a feasible design, before performing the nonlinear compensation on the first frequency-modulated signal by using the nonlinear compensation coefficient, the method further includes: determining a preset number of sampling points from the relationship curve by using the gain mismatch compensation coefficient and the relationship curve; and determining the nonlinear compensation coefficient according to each point in the preset number of sampling points, to obtain a preset number of nonlinear compensation coefficients.

In a feasible design, performing the nonlinear compensation on the first frequency-modulated signal by using the nonlinear compensation coefficient includes: determining a target nonlinear compensation coefficient from the preset number of nonlinear compensation coefficients according to an amplitude of the first frequency-modulated signal; and performing the nonlinear compensation on the first frequency-modulated signal by using the target nonlinear compensation coefficient.

In a feasible design, performing the gain mismatch compensation on the first frequency-modulated signal by using the gain mismatch compensation coefficient corresponding to the target carrier frequency includes: performing the gain mismatch compensation on the first frequency-modulated signal in a digital domain of the transmitter of the electronic device by using the gain mismatch compensation coefficient corresponding to the target carrier frequency, to obtain the first frequency-modulated signal subjected to gain mismatch compensation.

In a feasible design, shifting the local oscillator frequency of the electronic device to the target carrier frequency includes: shifting the local oscillator frequency of the electronic device to the target carrier frequency when the electronic device is started.

In a second aspect, an embodiment of the present disclosure provides a signal transmitting apparatus, including:
- a processing module configured to process a to-be-transmitted signal of an electronic device to obtain a first frequency-modulated signal and a second frequency-modulated signal, the first frequency-modulated signal and the second frequency-modulated signal being two paths of same signals, and the electronic device working at a target carrier frequency;
- a gain mismatch compensation module configured to perform gain mismatch compensation on the first frequency-modulated signal by using a gain mismatch compensation coefficient corresponding to the target carrier frequency, to obtain a first frequency-modulated signal subjected to gain mismatch compensation, the gain mismatch compensation coefficient being determined according to an output voltage of a high-pass channel of a transmitter of the electronic device and an output frequency of a voltage-controlled oscillator VCO of the transmitter;
- a conversion module configured to convert the first frequency-modulated signal subjected to gain mismatch compensation into a first analog signal by using the high-pass channel;
- an output module configured to control the VCO by using the first analog signal and a second analog signal so that the VCO outputs a third analog signal, the second analog signal being obtained by converting the second frequency-modulated signal by using a low-pass channel; and
- a transmitting module configured to transmit the third analog signal.

In a feasible design, the above-mentioned apparatus further includes:
- a nonlinear compensation module configured to perform nonlinear compensation on the first frequency-modulated signal by using a nonlinear compensation coefficient before the gain mismatch compensation module performs the gain mismatch compensation on the first frequency-modulated signal by using the gain mismatch compensation coefficient to obtain the first frequency-modulated signal subjected to gain mismatch compensation, the nonlinear compensation coefficient being determined according to the gain mismatch compensation coefficient, the output voltage of the high-pass channel and the output frequency of the voltage-controlled oscillator VCO.

In a feasible design, the above-mentioned apparatus further includes:
- a calibration module configured to: shift a local oscillator frequency of the electronic device to the target carrier frequency; input N sample frequency-modulated signals into the high-pass channel so that the high-pass channel outputs N output voltages, N being greater than or equal to 1 and being an integer; control, by using the N output voltages, the VCO to generate N output frequencies; determine a relationship curve between the output voltage of the high-pass channel and the output frequency of the VCO according to the N output voltages and the N output frequencies; and determine, according to the relationship curve, the gain mismatch compensation coefficient corresponding to the target carrier frequency, before the gain mismatch compensation module performs the gain mismatch compensation on the first frequency-modulated signal by using the gain mismatch compensation coefficient corresponding to the target carrier frequency to obtain the first frequency-modulated signal subjected to gain mismatch compensation.

In a feasible design, when determining the relationship curve between the output voltage of the high-pass channel and the output frequency of the VCO according to the N output voltages and the N output frequencies, the calibration module is configured to: obtain N frequency differences by using the N output frequencies and the local oscillator frequency, a maximum value in the N frequency differences being greater than a working difference, and the working difference being used for indicating a maximum frequency modulation range of the high-pass channel when the electronic device works at the target carrier frequency; and determine the relationship curve according to the N frequency differences and the N sample frequency modulated signals.

In a feasible design, the calibration module is further configured to: determine a preset number of sampling points from the relationship curve by using the gain mismatch compensation coefficient and the relationship curve; and determine the nonlinear compensation coefficient according to each point in the preset number of sampling points, to obtain a preset number of nonlinear compensation coefficients.

In a feasible design, when performing the nonlinear compensation on the first frequency-modulated signal by using the nonlinear compensation coefficient, the nonlinear compensation module is configured to: determine a target nonlinear compensation coefficient from the preset number of nonlinear compensation coefficients according to an amplitude of the first frequency-modulated signal; and perform the nonlinear compensation on the first frequency-modulated signal by using the target nonlinear compensation coefficient.

In a feasible design, when performing the gain mismatch compensation on the first frequency-modulated signal by using the gain mismatch compensation coefficient corresponding to the target carrier frequency, the gain mismatch compensation module is configured to: perform the gain mismatch compensation on the first frequency-modulated signal in a digital domain of the transmitter of the electronic device by using the gain mismatch compensation coefficient corresponding to the target carrier frequency, to obtain the first frequency-modulated signal subjected to gain mismatch compensation.

In a feasible design, the calibration module shifts the local oscillator frequency of the electronic device to the target carrier frequency and is specifically configured to shift the local oscillator frequency of the electronic device to the target carrier frequency when the electronic device is started.

In a third aspect, an embodiment of the present disclosure provides an electronic device, including a processor, a memory and an executable instruction, where the executable instruction is stored in the memory and is configured to be executed by the processor, and the executable instruction is used for executing the method in the above-mentioned first aspect or various possible implementations of the first aspect.

In a fourth aspect, an embodiment of the present disclosure provides a computer-readable storage medium in which a computer-executable instruction is stored, where the computer-executable instruction is configured to, when executed by a processor, implement the method in the above-mentioned first aspect or various possible implementations of the first aspect.

According to the signal transmitting method and apparatus, the device, and the readable storage medium provided in the embodiments of the present disclosure, in a signal transmitting process, before entering a DAC, a first frequency modulated signal of a high-pass channel is first subjected to nonlinear compensation and gain mismatch compensation. The compensated first frequency-modulated signal is converted into a first analog signal on the high-pass channel, a first frequency-modulated signal on a low-pass channel is converted into a second analog signal, a VCO is controlled by using the two analog signals so that the VCO outputs a third analog signal, and finally the third analog signal is transmitted. In the process, a nonlinear compensation coefficient and a gain mismatch compensation coefficient are determined according to an output voltage of the high-pass channel and an output frequency of the voltage-controlled oscillator VCO during a calibration stage. Therefore, the high-pass channel is not required to be calibrated in the transmitting process. Moreover, calibration circuits in the calibration stage are all original circuits in a transmitter, and no additional circuit needs to be added, thereby avoiding increasing the cost and power consumption of the electronic device. In addition, nonlinear calibration is further introduced, thereby avoiding non-linear effects in voltage and frequency conversion of the high-pass channel, and further improving the quality of signal transmission.

According to the signal transmitting method and apparatus, the device, and the readable storage medium provided in the embodiments of the present disclosure, in a signal transmitting process, before entering a DAC, a first frequency modulated signal of a high-pass channel is first subjected to nonlinear compensation and gain mismatch compensation. The compensated first frequency-modulated signal is converted into a first analog signal on the high-pass channel, a first frequency-modulated signal on a low-pass channel is converted into a second analog signal, a VCO is controlled by using the two analog signals so that the VCO outputs a third analog signal, and finally the third analog signal is transmitted. In the process, a nonlinear compensation coefficient and a gain mismatch compensation coefficient are determined according to an output voltage of the high-pass channel and an output frequency of the voltage-controlled oscillator VCO during a calibration stage. Therefore, the high-pass channel is not required to be calibrated in the transmitting process. Moreover, calibration circuits in the calibration stage are all original circuits in a transmitter, and no additional circuit needs to be added, thereby avoiding increasing the cost and power consumption of the electronic device. In addition, nonlinear calibration is further introduced, thereby avoiding non-linear effects in voltage and frequency conversion of the high-pass channel, and further improving the quality of signal transmission.

Those skilled in the art will readily envision other implementations of the present disclosure after considering the specification and practicing the technical solutions disclosed herein. The present disclosure is intended to cover any variations, purposes or adaptive changes of the present disclosure, and these variations, purposes or adaptive changes conform to a general principle of the present disclosure and include common knowledge or conventional technical means in the technical field not disclosed in the present disclosure. The specification and the embodiments are merely regarded to be exemplary, and the true scope and spirit of the present disclosure are appointed by the following claims.

It should be understood that the present disclosure is not limited to precise structures which have been described above and shown in the accompanying drawings, and various modifications and alterations may be made without departing from the scope thereof. The scope of the present disclosure is merely limited by the appended claims.

What is claimed is:

1. A signal transmitting method, comprising:
processing a to-be-transmitted signal of an electronic device to obtain a first frequency-modulated signal and a second frequency-modulated signal, the first frequency-modulated signal and the second frequency-modulated signal being two paths of same signals, and the electronic device working at a target carrier frequency;
performing gain mismatch compensation on the first frequency-modulated signal by using a gain mismatch compensation coefficient corresponding to the target carrier frequency, to obtain a first frequency-modulated signal subjected to gain mismatch compensation, the gain mismatch compensation coefficient being determined according to an output voltage of a high-pass channel of a transmitter of the electronic device and an output frequency of a voltage-controlled oscillator (VCO) of the transmitter;
converting the first frequency-modulated signal subjected to gain mismatch compensation into a first analog signal by using the high-pass channel;
controlling the VCO by using the first analog signal and a second analog signal so that the VCO outputs a third analog signal, the second analog signal being obtained by converting the second frequency-modulated signal by using a low-pass channel; and
transmitting the third analog signal.

2. The method of claim 1, wherein before performing the gain mismatch compensation on the first frequency-modulated signal by using the gain mismatch compensation coefficient corresponding to the target carrier frequency, to obtain the first frequency-modulated signal subjected to gain mismatch compensation, the method further comprises:
performing nonlinear compensation on the first frequency-modulated signal by using a nonlinear compensation coefficient, the nonlinear compensation coefficient being determined according to the gain mismatch compensation coefficient, the output voltage of the high-pass channel and the output frequency of the VCO.

3. The method of claim 2, wherein before performing the gain mismatch compensation on the first frequency-modulated signal by using the gain mismatch compensation coefficient corresponding to the target carrier frequency to obtain the first frequency-modulated signal subjected to gain mismatch compensation, the method further comprises:
shifting a local oscillator frequency of the electronic device to the target carrier frequency;
inputting N sample frequency-modulated signals into the high-pass channel so that the high-pass channel outputs N output voltages, N being greater than or equal to 1 and being an integer;

controlling, by using the N output voltages, the VCO to generate N output frequencies;

determining a relationship curve between the output voltage of the high-pass channel and the output frequency of the VCO according to the N output voltages and the N output frequencies; and determining, according to the relationship curve, the gain mismatch compensation coefficient corresponding to the target carrier frequency.

4. The method of claim 3, wherein determining the relationship curve between the output voltage of the high-pass channel and the output frequency of the VCO according to the N output voltages and the N output frequencies comprises:

obtaining N frequency differences by using the N output frequencies and the local oscillator frequency, a maximum value in the N frequency differences being greater than a working difference, and the working difference being used for indicating a maximum frequency modulation range of the high-pass channel when the electronic device works at the target carrier frequency; and determining the relationship curve according to the N frequency differences and the N sample frequency modulated signals.

5. The method of claim 3, wherein before performing the nonlinear compensation on the first frequency-modulated signal by using the nonlinear compensation coefficient, the method further comprises:

determining a preset number of sampling points from the relationship curve by using the gain mismatch compensation coefficient and the relationship curve; and determining the nonlinear compensation coefficient according to each point in the preset number of sampling points, to obtain a preset number of nonlinear compensation coefficients.

6. The method of claim 5, wherein performing the nonlinear compensation on the first frequency-modulated signal by using the nonlinear compensation coefficient comprises:

determining a target nonlinear compensation coefficient from the preset number of nonlinear compensation coefficients according to an amplitude of the first frequency-modulated signal; and performing the nonlinear compensation on the first frequency-modulated signal by using the target nonlinear compensation coefficient.

7. The method of claim 3, wherein performing the gain mismatch compensation on the first frequency-modulated signal by using the gain mismatch compensation coefficient corresponding to the target carrier frequency comprises:

performing the gain mismatch compensation on the first frequency-modulated signal in a digital domain of the transmitter of the electronic device by using the gain mismatch compensation coefficient corresponding to the target carrier frequency, to obtain the first frequency-modulated signal subjected to gain mismatch compensation.

8. The method of claim 3, wherein shifting the local oscillator frequency of the electronic device to the target carrier frequency comprises:

shifting the local oscillator frequency of the electronic device to the target carrier frequency when the electronic device is started.

9. An electronic device, comprising a processor, a memory and an electronic device program stored in the memory and runnable on the processor, wherein the processor, when executing the program, is enabled to:

process a to-be-transmitted signal of an electronic device to obtain a first frequency-modulated signal and a second frequency-modulated signal, the first frequency-modulated signal and the second frequency-modulated signal being two paths of same signals, and the electronic device working at a target carrier frequency;

perform gain mismatch compensation on the first frequency-modulated signal by using a gain mismatch compensation coefficient corresponding to the target carrier frequency, to obtain a first frequency-modulated signal subjected to gain mismatch compensation, the gain mismatch compensation coefficient being determined according to an output voltage of a high-pass channel of a transmitter of the electronic device and an output frequency of a voltage-controlled oscillator (VCO) of the transmitter;

convert the first frequency-modulated signal subjected to gain mismatch compensation into a first analog signal by using the high-pass channel;

control the VCO by using the first analog signal and a second analog signal so that the VCO outputs a third analog signal, the second analog signal being obtained by converting the second frequency-modulated signal by using a low-pass channel; and transmit the third analog signal.

10. The electronic device of claim 9, wherein the processor is further enabled to:

perform nonlinear compensation on the first frequency-modulated signal by using a nonlinear compensation coefficient, the nonlinear compensation coefficient being determined according to the gain mismatch compensation coefficient, the output voltage of the high-pass channel and the output frequency of the VCO.

11. The electronic device of claim 10, wherein the processor is further enabled to:

shift a local oscillator frequency of the electronic device to the target carrier frequency;

input N sample frequency-modulated signals into the high-pass channel so that the high-pass channel outputs N output voltages, N being greater than or equal to 1 and being an integer;

control, by using the N output voltages, the VCO to generate N output frequencies;

determine a relationship curve between the output voltage of the high-pass channel and the output frequency of the VCO according to the N output voltages and the N output frequencies; and determine, according to the relationship curve, the gain mismatch compensation coefficient corresponding to the target carrier frequency.

12. The electronic device of claim 11, wherein the processor is enabled to:

obtain N frequency differences by using the N output frequencies and the local oscillator frequency, a maximum value in the N frequency differences being greater than a working difference, and the working difference being used for indicating a maximum frequency modulation range of the high-pass channel when the electronic device works at the target carrier frequency; and determine the relationship curve according to the N frequency differences and the N sample frequency modulated signals.

13. The electronic device of claim 11, wherein the processor is further enabled to:
   determine a preset number of sampling points from the relationship curve by using the gain mismatch compensation coefficient and the relationship curve; and
   determine the nonlinear compensation coefficient according to each point in the preset number of sampling points, to obtain a preset number of nonlinear compensation coefficients.

14. The electronic device of claim 13, wherein the processor is enabled to:
   determine a target nonlinear compensation coefficient from the preset number of nonlinear compensation coefficients according to an amplitude of the first frequency-modulated signal; and
   perform the nonlinear compensation on the first frequency-modulated signal by using the target nonlinear compensation coefficient.

15. The electronic device of claim 11, wherein the processor is enabled to:
   perform the gain mismatch compensation on the first frequency-modulated signal in a digital domain of the transmitter of the electronic device by using the gain mismatch compensation coefficient corresponding to the target carrier frequency, to obtain the first frequency-modulated signal subjected to gain mismatch compensation.

16. The electronic device of claim 11, wherein the processor is enabled to:
   shift the local oscillator frequency of the electronic device to the target carrier frequency when the electronic device is started.

17. A non-transitory readable storage medium in which an instruction is stored, wherein the instruction, when running on an electronic device, enables the electronic device to:
   process a to-be-transmitted signal of an electronic device to obtain a first frequency-modulated signal and a second frequency-modulated signal, the first frequency-modulated signal and the second frequency-modulated signal being two paths of same signals, and the electronic device working at a target carrier frequency;
   perform gain mismatch compensation on the first frequency-modulated signal by using a gain mismatch compensation coefficient corresponding to the target carrier frequency, to obtain a first frequency-modulated signal subjected to gain mismatch compensation, the gain mismatch compensation coefficient being determined according to an output voltage of a high-pass channel of a transmitter of the electronic device and an output frequency of a voltage-controlled oscillator (VCO) of the transmitter;
   convert the first frequency-modulated signal subjected to gain mismatch compensation into a first analog signal by using the high-pass channel;
   control the VCO by using the first analog signal and a second analog signal so that the VCO outputs a third analog signal, the second analog signal being obtained by converting the second frequency-modulated signal by using a low-pass channel; and
   transmit the third analog signal.

18. The storage medium of claim 17, wherein the instruction, when running on the electronic device, further enables the electronic device to:
   perform nonlinear compensation on the first frequency-modulated signal by using a nonlinear compensation coefficient, the nonlinear compensation coefficient being determined according to the gain mismatch compensation coefficient, the output voltage of the high-pass channel and the output frequency of the VCO.

19. The storage medium of claim 18, wherein the instruction, when running on the electronic device, further enables the electronic device to:
   shift a local oscillator frequency of the electronic device to the target carrier frequency;
   input N sample frequency-modulated signals into the high-pass channel so that the high-pass channel outputs N output voltages, N being greater than or equal to 1 and being an integer;
   control, by using the N output voltages, the VCO to generate N output frequencies;
   determine a relationship curve between the output voltage of the high-pass channel and the output frequency of the VCO according to the N output voltages and the N output frequencies; and
   determine, according to the relationship curve, the gain mismatch compensation coefficient corresponding to the target carrier frequency.

20. The storage medium of claim 19, wherein the instruction, when running on the electronic device, enables the electronic device to:
   obtain N frequency differences by using the N output frequencies and the local oscillator frequency, a maximum value in the N frequency differences being greater than a working difference, and the working difference being used for indicating a maximum frequency modulation range of the high-pass channel when the electronic device works at the target carrier frequency; and
   determine the relationship curve according to the N frequency differences and the N sample frequency modulated signals.

* * * * *